United States Patent [19]

Scordo

[11] 4,340,863
[45] Jul. 20, 1982

[54] SMOOTH PULSE SEQUENCE GENERATOR
[75] Inventor: Dominick Scordo, Union, N.J.
[73] Assignee: Bell Telephone Laboratories, Incorporated, Murray Hill, N.J.
[21] Appl. No.: 152,647
[22] Filed: May 23, 1980
[51] Int. Cl.³ .............................................. H03K 5/13
[52] U.S. Cl. ..................................... 328/63; 364/703; 328/74; 328/75
[58] Field of Search ........................ 328/63, 72, 73, 74, 328/75; 307/269; 364/701, 702, 703

[56] References Cited
U.S. PATENT DOCUMENTS

| | | | |
|---|---|---|---|
| 3,944,858 | 3/1976 | Pettersson | 307/269 |
| 4,034,302 | 7/1977 | May | 328/39 |
| 4,101,761 | 7/1978 | Merryman | 328/63 X |
| 4,255,793 | 3/1981 | Nakamura | 328/63 X |
| 4,280,099 | 7/1981 | Rattlingourd | 328/63 |

OTHER PUBLICATIONS

Proceedings of the 3rd Annual Princeton Conference of Information Sciences and Systems–1969, pp. 350–354, "Smooth Pulse Sequences", by Lincoln et al.

Primary Examiner—John S. Heyman
Attorney, Agent, or Firm—Thomas Stafford; David R. Padnes

[57] ABSTRACT

A smooth pulse sequence (SSM) which is a rational fraction (M/N) of an available uniform sequence (SIN) is generated by employing an address generator (10) and a read only memory (ROM 15). Signal representations are stored in the ROM (15) which define the smooth sequence pulse transitions. The address generator (10) is driven by the reference signal and, in turn, generates a sequence of address signals which, when applied to the ROM (15) cause the smooth pulse sequence (SSM) to be read out. The smooth pulse sequence (SSM) is filtered (16) and shaped (17) to obtain a desired uniform pulse sequence (SOUT) which is in synchronism with the reference signal (SIN).

8 Claims, 4 Drawing Figures

SMOOTH PULSE SEQUENCE GENERATOR

TECHNICAL FIELD

This invention relates to a smooth pulse sequence generator that is capable of dividing a uniform pulse sequence by virtually any proper, predetermined rational fraction.

BACKGROUND OF THE INVENTION

The necessity increasingly arises in digital systems to generate a signal having a pulse rate which is related to a reference signal pulse rate by some (unusual) proper rational fraction, while still maintaining synchronism with the reference signal. In many instances, it is a requirement that the pulses of the generated signal be as uniformly spaced as possible within the constraint of synchronism. Sequences of such pulses are called "smooth" in contrast with uniform pulse sequences in which each pulse is separated from its predecessor by a fixed interval. The smooth pulse sequences possess a number of interesting properties in their structure. These properties are discussed in an article entitled "Smooth Pulse Sequences," by A. J. Lincoln et al. in *Proceedings of the Third Annual Princeton Conference on Information Sciences and Systems,* 1969, pp. 350–354.

A technique commonly employed to form synchronous pulse rate muliples uses a rate multiplier and involves detecting 0 to 1 transitions of stages of a binary counter chain. The rate multiplier technique, although often capable of forming relatively smooth sequences, does not form a true smooth sequence, as is noted in the above-cited article by A. J. Lincoln et al.

More recently, smooth pulse sequences have been generated by employing a complex digital divider arrangement including a plurality of routing circuits coupled in tandem, as disclosed in U.S. Pat. No. 4,034,302, issued to C. J. May Jr., on July 5, 1977. Although the May arrangement generates adequate smooth sequences, it is made up of a plurality of gate circuits which necessarily restrict the circuit to the generation of one fixed sequence. Additionally, this prior smooth pulse sequence generator is somewhat difficult to test and requires substantial energy as compared to modern circuit components. Thus, although this prior smooth pulse sequence generator may be adequate for some applications, it is undesirable for others.

SUMMARY OF THE INVENTION

These and other problems are overcome in a smooth pulse sequence generator, in accordance with an aspect of the invention, by storing signal samples defining desired smooth pulse sequence transitions (0 to 1 and 1 to 0) relative to predetermined pulse transitions of a reference signal having a uniform pulse sequence to be divided and by reading out the stored samples in accordance with a prescribed relationship dependent on the reference signal pulse rate.

More specifically, the pulse transition occurrences of the desired smooth pulse sequence are quantized by the period of the reference signal with a quantizer characteristic including rounding to generate a least jittered version of the desired smooth pulse sequence. That is to say, the smooth sequence pulse transitions are restricted to occur at predetermined reference sequence pulse transitions and are rounded to either the previous or subsequent one of the predetermined reference pulse transitions in accordance with prescribed criteria so that the resulting smooth pulse sequence periods are within a predetermined maximum error related to the period of the reference sequence.

One embodiment of the invention includes an address generator and a read only memory (ROM). Signal samples are stored in the ROM defining the smooth sequence pulse transitions relative to the predetermined pulse transitions of the reference signal having the uniform pulse sequence to be divided. The address generator is driven by the reference signal and, in turn, generates a sequence of address signals which, when applied to the ROM, cause the desired smooth pulse sequence to be read out. The smooth pulse sequence is then filtered and shaped to obtain an output signal having a desired, precise uniform pulse sequence which is in synchronism with the reference signal.

BRIEF DESCRIPTION OF THE DRAWING

The invention will be more fully understood from the following detailed description of an illustrative embodiment thereof taken in connection with the appended figures, in which.

DETAILED DESCRIPTION

The fractional synthesizer embodiment of the invention is intended to generate a desired uniform pulse sequence SOUT which is a rational fraction M/N of and is in synchronism with a reference uniform sequence SIN, namely, $$SOUT = SIN \cdot M/N, \qquad (1)$$

where M is the numerator and N is the denominator of the fraction.

For purposes of description, let us assume that the smooth pulse sequence generator embodiment of the invention receives uniform pulse sequence SIN of 16.384 Mbs, produces smooth pulse sequence SSM and, in turn, generates uniform pulse sequence SOUT of 6.176 Mbs. Note that the fraction $6.176 \times 10^6 / 16.384 \times 10^6$ can be reduced to the prime fraction $M/N = 193/512$. Therefore, the desired smooth pulse sequence is periodic, producing $M = 193$ output pulses for each $N = 512$ input pulses. The numbers used for purposes of illustration are not entirely arbitrary or fortuitous, e.g., the numerator (193) of the prime fraction is the same as the number of bits per frame of the T1 Carrier (see "The T1 Carrier System" by D. F. Hoth, *Bell Laboratories Record,* November 1962, pages 358–363). However, as will be evident hereinafter, the principles of the present invention are of general applicability and a smooth pulse sequence generator can be designed in accordance with the invention to divide any given uniform pulse sequence by virtually any predetermined rational fraction.

Figure 1:
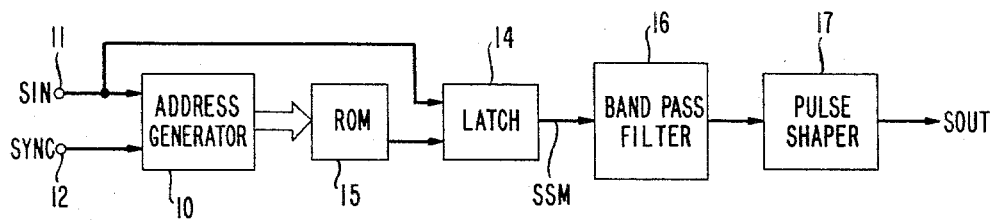
FIG. 1 shows in simplified block diagram form a fractional synthesizer including a smooth pulse sequence generator incorporating the invention.

FIG. 1 illustrates in simplified block diagram form a fractional synthesizer including one embodiment of a smooth pulse sequence generator incorporating the invention.

Accordingly, shown in FIG. 1 is address generator 10 to which reference signal SIN is supplied via terminal 11 and to which signal SYNC is supplied via terminal 12. Reference signal SIN is also supplied to an input of latch circuit 14. Address generator 10 is a digital counter having a predetermined number of stages for generating a sequence of digital address signals corresponding to the number of memory locations employed in read only memory (ROM) 15. As explained hereinafter, ROM 15 has at least N memory locations, in this example, 512. Consequently, counter 10 generates a corresponding sequence of N addresses, i.e., 0 to N-1, in this example, 0 to 511. Thus, address generator 10 essentially divides reference signal SIN by N. The address signals are supplied in well known fashion to ROM 15. Signal SYNC is employed to synchronize address generator 10 to other system waveforms and may not be necessary in certain applications.

ROM 15 may be any of a number of memory units now commercially available. As indicated hereinafter, ROM 15 has at least N one bit memory locations. Signal bits stored in ROM 15 define pulse transitions in desired smooth pulse sequence SSM. Generation of the pulse transition positions to obtain a least jittered smooth pulse sequence is described below. ROM 15 responds to the supplied address signals to output the signal samples, i.e., logical 1 or 0, stored in the memory locations in sequence as driven by reference sequence SIN. The output bits from ROM 15 are supplied to latch 14.

Latch 14 is employed to compensate for delays experienced in address generator 10 and ROM 15. To this end, the pulse transitions outputted from latch 14 are synchronized to correspond to transitions of SIN in a manner which will be apparent to those skilled in the art. The output of latch 14 and also ROM 15 is at least jittered version of desired smooth sequence SSM and is supplied to bandpass filter 16.

Bandpass filter 16 is employed to extract the desired uniform sequence component, i.e., 6.176 Mbs, from smooth sequence SSM. To this end, a two-pole monolithic crystal filter is used, with a 6 KHz, 3 dB passband centered at 6.176 MHz. An output of filter 16 is supplied to pulse shaper 17 to generate the desired uniform sequence SOUT having, in this example, a 6.176 Mbs regular pulse train with 50 percent duty cycle.

The 6.176 MBs pulse train is readily divided by 4 to obtain the well known 1.544 Mbs T-Carrier pulse rate.

Figure 2:
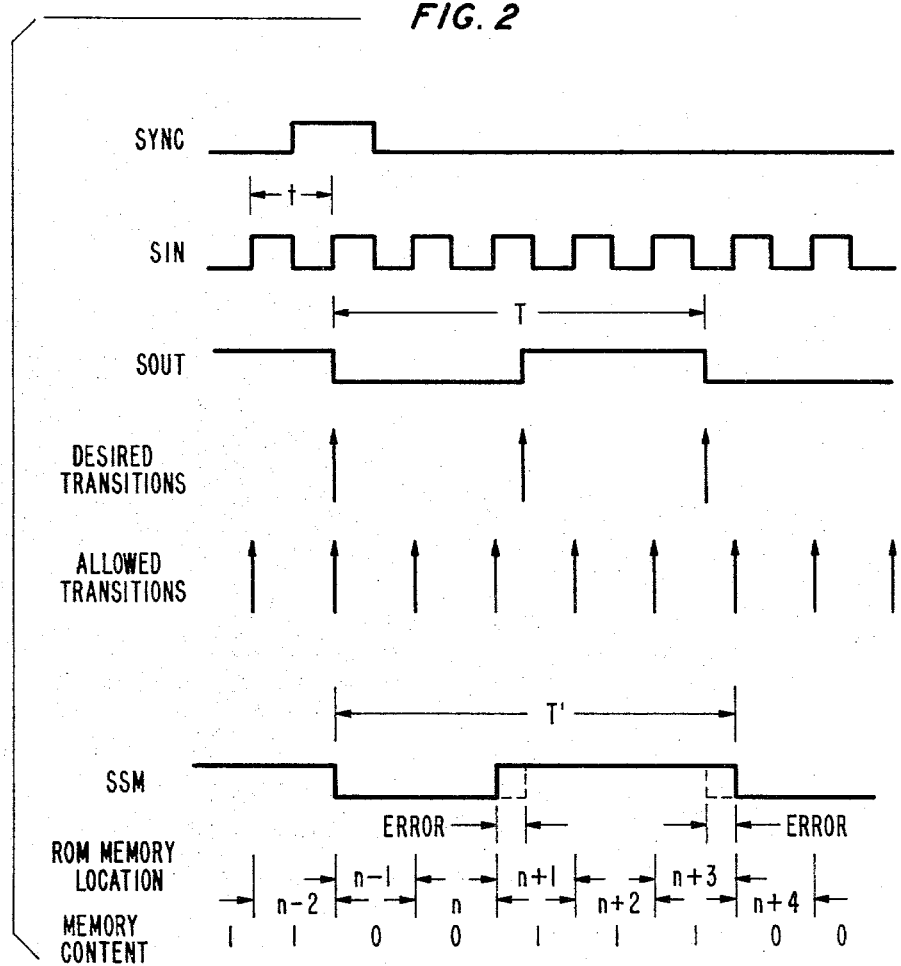
FIG. 2 graphically illustrates a sequence of waveforms useful in describing the operation of the embodiment shown in FIG. 1.

Uniform pulse sequence SIN of 16.384 Mbs is illustrated in FIG. 2 having period t. Signal SYNC is also shown, and in this example is the 8 KHz T-Carrier SYNC signal. SOUT is a desired uniform pulse sequence which is M/N of SIN, or, in this example, 6.176 Mbs and has a period of T. To obtain the desired uniform pulse sequence having period T, desired pulse transitions (0 to 1 and 1 to 0) should occur as shown. However, since the division of SIN is a prime fraction, pulse transitions are only allowed to occur, in this example, at positive going, i.e., 0 to 1, pulse transitions of SIN. Consequently, the desired pulse transitions must be rounded to the allowed transitions pulse resulting in smooth sequence SSM having a maximum error $\pm t/2$. Accordingly, appropriately logical signals are stored in memory locations of ROM 15 as shown to realize the desired least jittered smooth pulse sequence SSM. It should be noted that the allowed transition need not be restricted to the positive transitions of SIN and any other desirable arrangement may be used, as will be apparent to those skilled in the art.

To realize a particular fractional synthesis operation, factors to be considered are size of ROM 15, number of pulse transitions to be synthesized and the phase relationship with other signals employed. For a fraction M/N, the size of ROM 15 is at least $N \times 1$ memory locations. Minimizing M/N to a prime fraction minimizes the size of ROM 15.

The procedure for generating the digital signals to be stored in ROM 15 includes:

Computing the desired pulse transition occurrences (FIG. 2) for a desired uniform pulse sequence in interval Nt.

Computing the allowed pulse transition occurrences (FIG. 2) by rounding the desired pulse transition occurrences so that the maximum error from each of the desired pulse transition occurrences is limited to $\pm t/2$. This results in an array of ROM 15 memory locations having stored signals representing 0-to-1 and 1-to-0 transitions.

Assigning the computed logical signals to ROM 15 memory locations in a predetermined address sequence beginning with ROM 15 memory location address 0 through address $N-1$.

Figure 3:
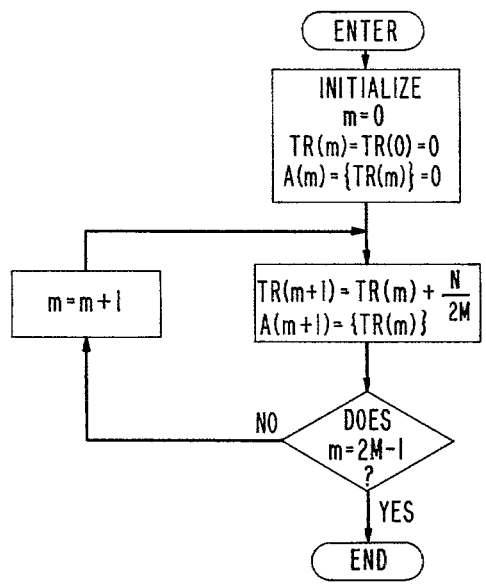
FIG. 3 is a flow chart illustrating the steps in obtaining the desired pulse transition positions.

FIG. 3 shows a flow chart of the process for determining the desired pulse transition occurrences.

After initialization, the first desired pulse transition is computed via $$TR(m+1) = TR(m) + N/2M \qquad (2)$$

where m is the desired transition number, $$m=0 \text{ to } m=2M-1 \qquad (3)$$

and beginning at $$TR(0) = 0. \qquad (4)$$

Each TR(m) is a non-integer number representative of a corresponding transition occurrence of the desired uniform pulse sequence normalized to period t of uniform pulse sequence SIN being divided.

The pulse transitions of smooth pulse sequence SSM (FIG. 2) are computed by rounding with 50% probability the desired pulse transition occurrences. That is, if the desired pulse transition occurs at a position in relation to the allowed pulse transitions which is less than t/2 the rounding is to the preceding allowed pulse transition and if the desired pulse transition occurs at a position equal to or greater than t/2, the rounding is to the next subsequent allowed pulse transition. Consequently, the addresses of memory locations of the pulse transition occurrences are represented by an array of integers $$A(m) = \{TR(m)\} \qquad (5)$$

where {} indicates rounding.

Figure 4:
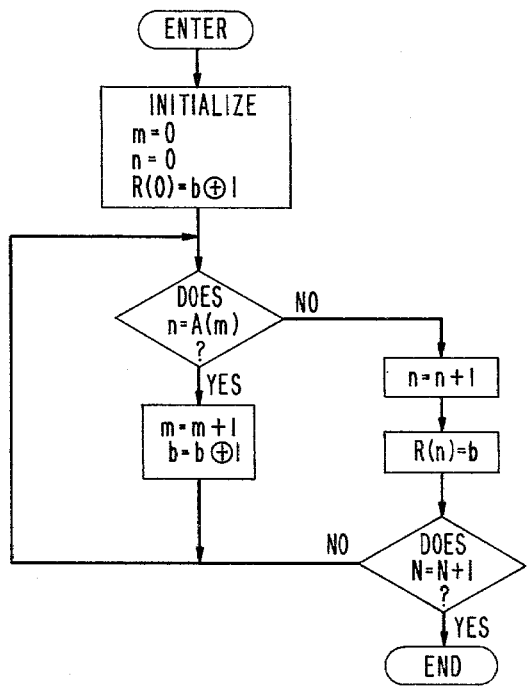
FIG. 4 is a flow chart illustrating the steps taken to generate the smooth pulse sequence samples to be stored in ROM memory locations of FIG. 1.

FIG. 4 is a flow chart of a process for generating the bit pattern stored in memory locations of ROM 15 to obtain desired smooth pulse sequence SSM. Memory locations are represented by n, namely $$n \in [0, N-1] \qquad (6)$$

and the corresponding memory location content is represented by R(n), namely, $$R(n) \in [0,1] \quad (7)$$

Then, starting at a convenient transition n=A(m)=0, R(O)=b is chosen either to be a logical 0 if a 1-to-0 pulse transition is to occur or to be a logical 1 if a 0-to-1 pulse transition is to occur. ROM 15 address n is advanced and the memory signal content remains the same until the next transition in smooth pulse sequence SSM being generated is reached. That is to say, the memory locations of ROM 15 between pulse transitions of smooth pulse sequence SSM have bits stored therein the same as the previous transition.

I claim:

1. A pulse sequence generator of the type capable of dividing a reference signal having a uniform pulse sequence by a predetermined rational fraction to produce a smooth pulse sequence, characterized by,
   means responsive to the reference signal for generating a sequence of address signals, and
   memory means having predetermined digital representation stored in predetermined ones of a plurality of memory locations defining pulse transitions of said smooth pulse sequence which when read-out in response to said sequence of address signals form said smooth pulse sequence.

2. A smooth pulse sequence generator as defined in claim 1 wherein said means for generating a sequence of address signals includes a digital counter for generating an output sequence having a predetermined number of address signals proportional to the rational fraction denominator.

3. A smooth pulse sequence generator as defined in claim 2 wherein said memory means has a number of memory locations at least equal to the number of addresses generated by said digital counter.

4. A smooth pulse sequence generator as defined in claim 3 wherein said stored digital representations define a predetermined number of pulses in the smooth sequence proportional to the numerator of the rational fraction.

5. A smooth pulse sequence generator as defined in claim 4 wherein the rational fraction is of the form M/N, wherein said counter generates a sequence of N addresses in response to the reference signal and said memory means has at least N memory locations having digital representations stored therein defining M pulses in the smooth sequence.

6. A smooth pulse sequence generator as defined in claim 5 wherein said stored digital representations defining pulse transitions of the smooth sequence are determined by locating the transitions at occurrences of predetermined pulse transitions of the reference signal pulses in accordance with prescribed criteria.

7. A smooth pulse sequence generator as defined in claim 6 wherein said prescribed criteria includes rounding the smooth sequence pulse transitions to a preceding predetermined pulse transition of the reference signal if a pulse transition of a desired uniform sequence occurs at a position of the reference signal period less than one half the reference signal period and rounded to a next subsequent predetermined pulse transition of the reference signal if the pulse transition of the desired uniform sequence is at a position of the reference signal period equal to or greater than one half the reference signal period.

8. A smooth sequence generator as defined in claim 7 further including a bandpass filter supplied with the smooth pulse sequence and pulse shaping means for generating a uniform pulse sequence having a pulse rate as the smooth pulse sequence.

* * * * *